(12) United States Patent
Liu et al.

(10) Patent No.: US 11,756,457 B2
(45) Date of Patent: Sep. 12, 2023

(54) FLEXIBLE DISPLAY SCREEN AND DISPLAY DEVICE

(71) Applicants: ORDOS YUANGHENG OPTOELECTRONICS CO., LTD., Inner Mongolia (CN); BOE TECHNOLOGY GROUP CO., LTD., Beijing (CN)

(72) Inventors: Lina Liu, Beijing (CN); Hualing Yang, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

(*) Notice: Subject to any disclaimer, the term of this patent is extended or adjusted under 35 U.S.C. 154(b) by 639 days.

(21) Appl. No.: 16/345,545

(22) PCT Filed: Sep. 20, 2018

(86) PCT No.: PCT/CN2018/106702
§ 371 (c)(1),
(2) Date: Apr. 26, 2019

(87) PCT Pub. No.: WO2019/085671
PCT Pub. Date: May 9, 2019

(65) Prior Publication Data
US 2021/0358342 A1    Nov. 18, 2021

(30) Foreign Application Priority Data
Oct. 30, 2017    (CN) .................. 201711052099.X

(51) Int. Cl.
*H10K 59/40* (2023.01)
*G09F 9/30* (2006.01)
(Continued)

(52) U.S. Cl.
CPC ............ *G09F 9/301* (2013.01); *G06F 3/0412* (2013.01); *G06F 3/0443* (2019.05);
(Continued)

(58) Field of Classification Search
CPC ....................................................... H10K 59/40
See application file for complete search history.

(56) References Cited

U.S. PATENT DOCUMENTS 10,120,515 B1 * 11/2018 Ghali .................... G06F 3/0446
10,817,099 B2 * 10/2020 Ryu ........................ G06F 3/041
(Continued)

FOREIGN PATENT DOCUMENTS

CN    205563517 U    9/2016
CN    106066730 A    11/2016
(Continued)

OTHER PUBLICATIONS

First Office Action dated Apr. 20, 2021 for application No. IN201947033795 with English translation attached.
(Continued)

*Primary Examiner* — Jae Lee
(74) *Attorney, Agent, or Firm* — Nath, Goldberg & Meyer; Joshua B. Goldberg

(57) ABSTRACT

The present disclosure provides a flexible display screen and a display device. The flexible display screen includes: a substrate; a backing film stacked on a side of the substrate facing away from a light-emitting surface of the flexible display screen; and a pressure sensor stacked on a side of the backing film facing away from the substrate and configured to output a signal related to a force applied on the flexible display screen.

10 Claims, 2 Drawing Sheets

(51) Int. Cl.
*G06F 3/044* (2006.01)
*G06F 3/041* (2006.01)
*H10K 50/87* (2023.01)
*H10K 50/86* (2023.01)
*H10K 59/121* (2023.01)
*H10K 102/00* (2023.01)

(52) U.S. Cl.
CPC ........... *H10K 50/865* (2023.02); *H10K 50/87* (2023.02); *H10K 59/121* (2023.02); *H10K 59/40* (2023.02); *G06F 2203/04102* (2013.01); *G06F 2203/04105* (2013.01); *H10K 2102/311* (2023.02)

(56) References Cited

U.S. PATENT DOCUMENTS

| | | | |
|---|---|---|---|
| 2017/0090637 A1* | 3/2017 | Yoon | G06F 3/0447 |
| 2017/0308212 A1 | 10/2017 | Jin et al. | |
| 2018/0136762 A1* | 5/2018 | Jeong | G06F 3/0445 |
| 2018/0166507 A1* | 6/2018 | Hwang | G06F 3/04166 |
| 2018/0217686 A1* | 8/2018 | Qiao | G06F 3/03545 |
| 2018/0246610 A1 | 8/2018 | Yang | |
| 2019/0196641 A1* | 6/2019 | Ryu | G06F 3/0414 |

FOREIGN PATENT DOCUMENTS

| | | |
|---|---|---|
| CN | 106125986 A | 11/2016 |
| CN | 107246930 A | 10/2017 |
| CN | 206568984 U | 10/2017 |
| JP | 2016059030 A | 4/2016 |
| WO | 2017026364 A1 | 2/2017 |

OTHER PUBLICATIONS

Extended European Search Report dated Jun. 21, 2021 for application No. EP18867309.9.
First Office Action with search report in corresponding CN application 201711052099.X dated Sep. 2, 2019, with full English translation.
International Search Report, ISA/210 and ISA/237 for PCT/CN2018/106702 dated Dec. 26, 2018; with English translation of PCT-ISA-210 and Box No. V of Form PCT/ISA-237.
Second Office Action dated Feb. 3, 2020, for corresponding Chinese application 201711052099.X.
First Office Action dated Aug. 19, 2022 for application No. JP2019-543847 with English translation attached.

* cited by examiner

FLEXIBLE DISPLAY SCREEN AND DISPLAY DEVICE

CROSS-REFERENCE TO RELATED APPLICATION

This is a National Phase Application filed under 35 U.S.C. 371 as a national stage of PCT/CN2018/106702, filed Sep. 20, 2018, an application claiming priority from Chinese patent application No. 201711052099.X filed with the China National Intellectual Property Administration on Oct. 30, 2017, the disclosure of which is incorporated herein by reference in its entirety.

TECHNICAL FIELD

The present disclosure relates to the technical field of display technology, and particularly relates to a flexible display screen and a display device.

BACKGROUND

In recent years, with the emergence and continuous development of OLED display technology, flexible display and flexible pressure touch control technologies have emerged accordingly. Currently in the field of display, especially in the field of mobile phones or tablets, pressure sensors that sense a pressure on a display panel usually require to be formed on an additional glass substrate, which is then incorporated into a flexible display panel. In this way, a thickness of the flexible display panel is increased due to the addition of the glass substrate.

SUMMARY

The present disclosure has been accomplished in order to solve at least part of the problems in the related art. The present disclosure provides a light and thin flexible display screen and a display device.

According to an aspect of the present disclosure, there is provided a flexible display screen, comprising:

a substrate;

a backing film stacked on a side of the substrate facing away from a light-emitting surface of the flexible display screen; and a pressure sensor stacked on a side of the backing film facing away from the substrate and configured to output a signal related to a force applied on the flexible display screen.

In some embodiments, the flexible display screen further includes a light shielding layer between the backing film and the pressure sensor.

In some embodiments, the flexible display screen further includes a light shielding layer between the substrate and the backing film.

In some embodiments, a material of the light shielding layer includes an ink.

In some embodiments, the pressure sensor includes: a first electrode, a dielectric layer, and a second electrode disposed in sequence along a direction away from the substrate with respect to the backing film.

In some embodiments, the second electrode is a ground electrode and is shared with a middle frame of the flexible display screen.

In some embodiments, a material of the dielectric layer includes a foam.

In some embodiments, the flexible display screen further includes a heat dissipation layer between the dielectric layer and the second electrode.

In some embodiments, a material of the heat dissipation layer includes copper and graphite.

In some embodiments, a material of the backing film is one of polyimide, polyethylene terephthalate, and cellulose triacetate.

In some embodiments, the flexible display screen further includes a plurality of pixel units located on the substrate, each of the pixel units including an organic electroluminescent diode.

In some embodiments, the flexible display screen further includes a touch control unit located on a side of the pixel units facing away from the substrate and configured to detect touch control in various directions to implement a 3D touch control function.

In some embodiments, the touch control unit includes a driving electrode and a sensing electrode.

In some embodiments, the foam is one of ethylene propylene diene monomer and polyurethane.

According to another aspect of the present disclosure, there is provided a display device including the above flexible display screen.

DETAILED DESCRIPTION

To improve understanding of the technical solution of the present disclosure for those skilled in the art, the present disclosure will now be described in detail in conjunction with accompanying drawings and specific embodiments.

Figure 1:
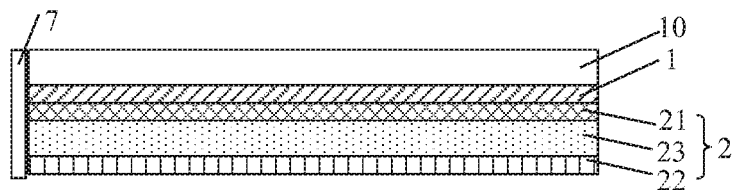
FIG. 1 is a schematic structural view showing a flexible display screen according to an exemplary embodiment of the disclosure.

According to an aspect of the present disclosure, there is provided a flexible display screen. As shown in FIG. 1, the flexible display screen includes a substrate 10, a backing film 1, and a pressure sensor 2. The backing film 1 is stacked on a side of the substrate 10 facing away from a light-emitting surface of the flexible display screen. The pressure sensor 2 is stacked on a side of the backing film 1 facing away from the substrate 10 and configured to output a signal related to a force applied on the flexible display screen.

Since the pressure sensor 2 in the flexible display screen of this exemplary embodiment is disposed on the backing film 1, it is not necessary to select a separate substrate (for example, a glass substrate in the related art) to form the pressure sensor 2, thereby making the formed flexible display with the pressure sensor 2 light and thin while reducing process costs.

In an exemplary embodiment of the present disclosure, the pressure sensor 2 is a capacitive pressure sensor which, as shown in FIG. 1, includes a first electrode 21, a dielectric layer 23, and a second electrode 22 disposed in sequence along a direction away from the substrate 10 with respect to the backing film 1. The second electrode 22 is a ground electrode having a monolithic-layer structure and is shared with the middle frame 7 of the flexible display screen (only a portion of a left side thereof is schematically shown in FIG. 1) so that the flexible display screen may be lighter and thinner. Each layer structure of the pressure sensor 2 (i.e., the first electrode 21, the dielectric layer 23, and the second electrode 22) may be completed by a printing process which is simple in process and high in yield. It should be noted that the pressure sensor 2 may be formed simply and conveniently by binding between the first electrode 21 and the dielectric layer 23 and between the dielectric layer 23 and the second electrode 22 with a double-sided tape.

In an exemplary embodiment of the present disclosure, a material of the dielectric layer 23 in the pressure sensor 2 is a foam, wherein the foam material may be an insulating material such as EPDM (ethylene propylene diene monomer), PU (polyurethane) or the like. Due to good elasticity, the foam is deformed when the pressure sensor 2 is pressed so that a distance between the first electrode 21 and the second electrode 22 may be changed. According to the capacitance formula: $C=\varepsilon S/d$, a capacitance change of the pressure sensor 2 may be thus obtained. It should be noted that, under normal circumstances, the capacitance formula is $C=\varepsilon S/4\pi kd$, but if a spacing d between two parallel electrode plates is much smaller than widths and lengths of the electrode plates, the capacitance formula is approximately $C=\varepsilon S/d$, where $\varepsilon$ is a dielectric constant of a dielectric between the electrode plates, S is an area of the electrode plates, and d is a distance between the electrode plates.

Figure 2:
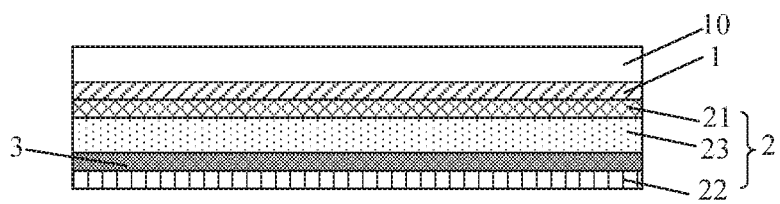
FIG. 2 is a schematic structural view showing a flexible display screen provided with a heat dissipation layer according to an exemplary embodiment of the present disclosure.

In an exemplary embodiment of the present disclosure, as shown in FIG. 2, the flexible display screen further includes a heat dissipation layer 3 between the dielectric layer 23 and the second electrode 22 for releasing heat produced by the flexible display screen. For example, when the flexible display screen is a mobile phone, the heat dissipation layer 3 in this case is mainly used for releasing heat generated by a battery of the mobile phone. A material of the heat dissipation layer 3 may include copper and graphite. Apparently, it is not limited to these two materials, and other materials having a heat release function may be used.

Figure 3:
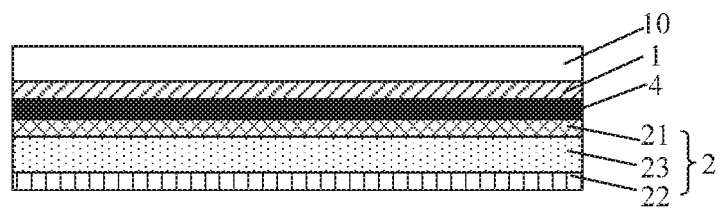
FIG. 3 is a schematic structural view showing a flexible display screen provided with a light shielding layer according to an exemplary embodiment of the present disclosure.
Figure 4:
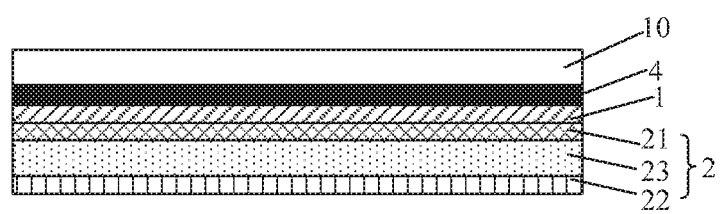
FIG. 4 is another schematic structural view showing a flexible display screen provided with a light shielding layer according to an exemplary embodiment of the present disclosure.

In an exemplary embodiment of the present disclosure, in order to prevent the pressure sensor 2 from being seen when the flexible display screen displays, as shown in FIG. 3, a light shielding layer 4 is disposed between the backing film 1 and the pressure sensor 2, or, as shown in FIG. 4, a light shielding layer 4 is provided between the substrate 10 and the backing film 1. A material of the light shielding layer 4 may be an ink, and apparently other opaque materials such as a black resin material may be used.

In an exemplary embodiment of the present disclosure, a material of the backing film includes: a polymer film material of any one of PI (polyimide), PET (polyethylene terephthalate), and TAC (cellulose triacetate). Apparently, it is not limited to the above materials, and other flexible materials may be used.

In an exemplary embodiment of the present disclosure, the flexible display screen may be an organic electroluminescent diode display screen. Therefore, as shown in FIG. 5, the flexible display screen further includes: a plurality of pixel units 5 located on the substrate 10, each of the pixel units 5 including an organic electroluminescent diode 51.

Figure 5:
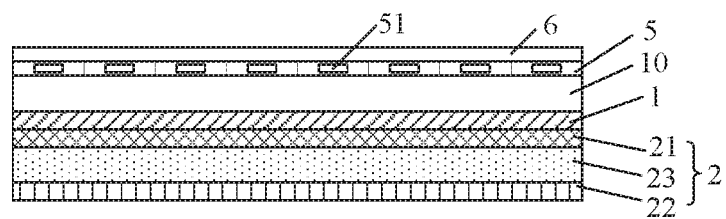
FIG. 5 is a schematic structural view showing a flexible display screen provided with pixel units and a touch control unit according to an exemplary embodiment of the present disclosure.

In an exemplary embodiment of the present disclosure, as shown in FIG. 5, a touch control unit 6 is further disposed on a light-emitting surface side of the pixel units 5 for implementing touch control. Generally, the touch control unit 6 includes a driving electrode and a sensing electrode. In this case, the flexible display screen in the exemplary embodiment may realize detections of touch control in three directions, X, Y, and Z, and implement the 3D touch control function. The entire module having the above configuration is relatively thinner and lighter, which is advantageous for bending of the flexible display screen.

According to another aspect of the present disclosure, there is provided a display device including the above flexible display screen, the detailed configuration of the flexible display screen is not repeated herein.

In an exemplary embodiment of the present disclosure, the display device may include: an OLED panel, a mobile phone, a tablet PC, a television, a monitor, a notebook computer, a digital album, a navigator or any other product or component having a display function.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A flexible display screen, comprising:
   a substrate;
   a backing film stacked on a side of the substrate facing away from a light-emitting surface of the flexible display screen;
   a pressure sensor stacked on a side of the backing film facing away from the substrate and configured to output a signal related to a force applied on the flexible display screen, and
   a plurality of pixel units located on a side of the substrate facing the light-emitting surface of the flexible display screen, each of the pixel units including an organic electroluminescent diode,
   wherein a material of the backing film is one of polyimide, polyethylene terephthalate, and cellulose triacetate,
   wherein the flexible display screen further comprises a light shielding layer, the light shielding layer being located between the backing film and the pressure sensor, or between the substrate and the backing film, and
   wherein a material of the light shielding layer includes an ink.

2. The flexible display screen according to claim 1, wherein the pressure sensor includes: a first electrode, a dielectric layer, and a second electrode disposed in sequence along a direction away from the substrate with respect to the backing film.

3. The flexible display screen according to claim 2, wherein the second electrode is a ground electrode and is shared with a middle frame of the flexible display screen.

4. The flexible display screen according to claim 2, wherein a material of the dielectric layer includes a foam.

5. The flexible display screen according to claim 2, further comprising a heat dissipation layer between the dielectric layer and the second electrode.

6. The flexible display screen according to claim 5, wherein a material of the heat dissipation layer includes copper and graphite.

7. The flexible display screen according to claim 1, further comprising a touch control unit located on a side of the pixel units facing away from the substrate and configured to detect touch control in various directions to implement a 3D touch control function.

8. The flexible display screen according to claim 7, wherein the touch control unit includes a driving electrode and a sensing electrode.

9. The flexible display screen according to claim 4, wherein the foam is one of ethylene propylene diene monomer and polyurethane.

10. A display device comprising the flexible display screen according to claim 1.

* * * * *